United States Patent
Lee et al.

(10) Patent No.: US 9,659,758 B2
(45) Date of Patent: May 23, 2017

(54) COILS UTILIZED IN VAPOR DEPOSITION APPLICATIONS AND METHODS OF PRODUCTION

(75) Inventors: Eal Lee, Milpitas, CA (US); Nicole Truong, Milpitas, CA (US); Robert Prater, Los Altos, CA (US); Norm Sand, Spokane, WA (US)

(73) Assignee: Honeywell International Inc., Morris Plains, NJ (US)

( * ) Notice: Subject to any disclaimer, the term of this patent is extended or adjusted under 35 U.S.C. 154(b) by 2343 days.

(21) Appl. No.: 11/086,022

(22) Filed: Mar. 22, 2005

(65) Prior Publication Data

US 2006/0213769 A1    Sep. 28, 2006

(51) Int. Cl.
*C23C 14/34* (2006.01)
*H01J 37/34* (2006.01)
*H01J 37/32* (2006.01)
*C23C 14/56* (2006.01)

(52) U.S. Cl.
CPC .......... *H01J 37/3405* (2013.01); *C23C 14/34* (2013.01); *C23C 14/564* (2013.01); *H01J 37/321* (2013.01); *H01J 37/32477* (2013.01); *H01J 37/32541* (2013.01); *H01J 37/32651* (2013.01); *H01J 37/3438* (2013.01)

(58) Field of Classification Search
CPC ........... H01J 37/32477; H01J 37/32541; H01J 37/32651; H01J 37/3438
USPC .................................................... 204/298.34
See application file for complete search history.

(56) References Cited

U.S. PATENT DOCUMENTS

| | | | |
|---|---|---|---|
| 2,586,007 A * | 2/1952 | Harkness et. al. | 411/438 |
| 4,999,096 A * | 3/1991 | Nihei et al. | 204/192.3 |
| 5,096,449 A | 3/1992 | Matsuzaki | |
| 5,178,739 A | 1/1993 | Barnes et al. | |
| 5,391,275 A | 2/1995 | Mintz | |
| 5,446,269 A * | 8/1995 | Peysakhovich et al. | 219/672 |
| 5,474,649 A | 12/1995 | Kava et al. | |
| 5,522,245 A | 6/1996 | Nozaki et al. | |
| 5,683,537 A * | 11/1997 | Ishii | 156/345.33 |
| 5,837,057 A | 11/1998 | Koyama et al. | |

(Continued)

FOREIGN PATENT DOCUMENTS

| EP | 0869543 A2 | 10/1998 |
|---|---|---|
| JP | 02-133570 | 5/1990 |

(Continued)

*Primary Examiner* — J Berman
(74) *Attorney, Agent, or Firm* — Faegre Baker Daniels LLP

(57) ABSTRACT

A coil assembly for utilization in a vapor deposition system is described herein that includes at least one subject coil having a length, a height, an inside edge, an outside edge and a thickness, wherein the thickness of the subject coil is measured as the distance between the inside edge and the outside edge and wherein at least part of the thickness of the subject coil is reduced by at least 20% as compared to a reference coil. A coil assembly is also described herein for utilization in a vapor deposition system that includes at least one subject coil having a length, a height, an inside edge, an outside edge, and a thickness, wherein the thickness of the subject coil is measured as the distance between the inside edge and the outside edge and wherein at least part of the height of at least part of the subject coil is reduced by at least 20% as compared to the height of a reference coil.

17 Claims, 4 Drawing Sheets

(56) References Cited

U.S. PATENT DOCUMENTS

| | | |
|---|---|---|
| 5,961,793 A | 10/1999 | Ngan |
| 5,993,594 A | 11/1999 | Wicker et al. |
| 6,001,227 A | 12/1999 | Pavate et al. |
| 6,042,700 A | 3/2000 | Gopalraja et al. |
| 6,077,402 A | 6/2000 | Hong et al. |
| 6,126,791 A | 10/2000 | Pavate et al. |
| 6,129,808 A | 10/2000 | Wicker et al. |
| 6,139,701 A | 10/2000 | Pavate et al. |
| 6,162,297 A | 12/2000 | Mintz et al. |
| 6,168,696 B1 | 1/2001 | Burton et al. |
| 6,171,455 B1 | 1/2001 | Pavate et al. |
| 6,200,433 B1 | 3/2001 | Ding et al. |
| 6,217,718 B1 | 4/2001 | Holmann et al. |
| 6,228,186 B1 | 5/2001 | Pavate et al. |
| 6,235,163 B1 | 5/2001 | Angelo et al. |
| 6,235,169 B1 | 5/2001 | Gopalraja et al. |
| 6,244,210 B1 | 6/2001 | Iacoponi et al. |
| 6,251,793 B1 | 6/2001 | Wicker et al. |
| 6,254,737 B1 | 7/2001 | Edelstein et al. |
| 6,254,746 B1 * | 7/2001 | Subramani et al. ..... 204/298.11 |
| 6,277,253 B1 | 8/2001 | Narasimhan et al. |
| 6,315,872 B1 | 11/2001 | Pavate et al. |
| 6,344,105 B1 | 2/2002 | Daugherty et al. |
| 6,344,419 B1 | 2/2002 | Forster et al. |
| 6,345,588 B1 | 2/2002 | Stimson |
| 6,348,113 B1 | 2/2002 | Michaluk et al. |
| 6,350,353 B2 | 2/2002 | Gopalraja et al. |
| 6,368,469 B1 | 4/2002 | Nulman et al. |
| 6,371,045 B1 | 4/2002 | Wang et al. |
| 6,394,026 B1 | 5/2002 | Wicker et al. |
| 6,398,929 B1 | 6/2002 | Chiang et al. |
| 6,413,383 B1 | 7/2002 | Chiang et al. |
| 6,451,179 B1 | 9/2002 | Xu et al. |
| 6,451,181 B1 | 9/2002 | Denning et al. |
| 6,461,483 B1 | 10/2002 | Gopalraja et al. |
| 6,464,794 B1 | 10/2002 | Park et al. |
| 6,464,843 B1 | 10/2002 | Wicker et al. |
| 6,506,287 B1 | 1/2003 | Ding |
| 6,582,569 B1 | 6/2003 | Chiang et al. |
| 6,583,064 B2 | 6/2003 | Wicker et al. |
| 6,610,184 B2 | 8/2003 | Ding et al. |
| 6,627,056 B2 | 9/2003 | Wang et al. |
| 6,652,717 B1 | 11/2003 | Hong |
| 6,660,134 B1 | 12/2003 | Gopalraja et al. |
| 6,660,140 B2 | 12/2003 | Buchanan et al. |
| 6,673,724 B2 | 1/2004 | Forster et al. |
| 6,699,375 B1 | 3/2004 | Crocker |
| 6,719,883 B2 | 4/2004 | Stimson |
| 6,783,639 B2 | 8/2004 | Nulman et al. |
| 6,797,109 B2 | 9/2004 | Park et al. |
| 6,812,471 B2 | 11/2004 | Popiolkowski et al. |
| 6,824,658 B2 | 11/2004 | Gopalraja et al. |
| 6,830,622 B2 | 12/2004 | O'Donnell et al. |
| 6,890,861 B1 | 5/2005 | Bosch |
| 6,893,513 B2 | 5/2005 | Michaluk et al. |
| 6,893,541 B2 | 5/2005 | Chiang et al. |
| 6,933,508 B2 | 8/2005 | Popiolkowski et al. |
| 6,942,929 B2 | 9/2005 | Han et al. |
| 6,969,953 B2 | 11/2005 | Schaepkens |
| 7,026,009 B2 | 4/2006 | Lin et al. |
| 7,041,201 B2 | 5/2006 | Gung et al. |
| 7,119,489 B2 | 10/2006 | Shin et al. |
| 7,160,616 B2 | 1/2007 | Massler et al. |
| 7,163,603 B2 | 1/2007 | Fink |
| 7,208,878 B2 | 4/2007 | Shin et al. |
| 7,220,497 B2 | 5/2007 | Chang |
| 7,229,510 B2 | 6/2007 | Nakamura |
| 7,247,888 B2 | 7/2007 | Ogihara et al. |
| 7,252,738 B2 | 8/2007 | Tong et al. |
| 7,300,537 B2 | 11/2007 | O'Donnell et al. |
| 7,311,784 B2 | 12/2007 | Fink |
| 7,311,797 B2 | 12/2007 | O'Donnell et al. |
| 7,318,879 B2 | 1/2008 | Kwon et al. |
| 7,332,426 B2 | 2/2008 | Ikeda et al. |
| 7,364,623 B2 | 4/2008 | Cirigliano |
| 7,371,467 B2 | 5/2008 | Han et al. |
| 7,374,648 B2 | 5/2008 | Hom et al. |
| 7,378,001 B2 | 5/2008 | Goergens et al. |
| 7,407,565 B2 | 8/2008 | Wang et al. |
| 7,430,986 B2 | 10/2008 | Dhindsa et al. |
| 7,431,782 B2 | 10/2008 | Michaluk et al. |
| 7,438,018 B2 | 10/2008 | Son |
| 7,455,748 B2 | 11/2008 | Keil et al. |
| 2001/0006171 A1 | 7/2001 | Holmes |
| 2001/0007302 A1 | 7/2001 | Hong |
| 2001/0019016 A1 | 9/2001 | Subramani et al. |
| 2001/0050220 A1 | 12/2001 | Chiang et al. |
| 2002/0047116 A1 | 4/2002 | Pavate et al. |
| 2002/0068449 A1 | 6/2002 | Hashim et al. |
| 2002/0084181 A1 | 7/2002 | Gopalraja et al. |
| 2002/0092763 A1 | 7/2002 | Denning et al. |
| 2003/0000648 A1 | 1/2003 | Park et al. |
| 2003/0168131 A1 | 9/2003 | Michaluk et al. |
| 2003/0188685 A1 | 10/2003 | Wang et al. |
| 2004/0118521 A1 | 6/2004 | Pancham et al. |
| 2004/0256217 A1 | 12/2004 | Nulman et al. |
| 2005/0006222 A1 | 1/2005 | Ding et al. |
| 2005/0017712 A1 | 1/2005 | Le |
| 2005/0048876 A1 | 3/2005 | West et al. |
| 2005/0064248 A1 | 3/2005 | O'Donnell et al. |
| 2005/0098427 A1 | 5/2005 | Cho et al. |
| 2005/0181617 A1 | 8/2005 | Bosch |
| 2005/0199491 A1 | 9/2005 | Gung et al. |
| 2005/0236270 A1 | 10/2005 | Cheng et al. |
| 2005/0255691 A1 | 11/2005 | Ding et al. |
| 2005/0271984 A1 | 12/2005 | Brueckner et al. |
| 2005/0284756 A1 | 12/2005 | Hom et al. |
| 2006/0070875 A1 | 4/2006 | Nulman et al. |
| 2006/0124634 A1 | 6/2006 | Mize et al. |
| 2006/0172542 A1 | 8/2006 | Bera et al. |
| 2006/0193102 A1 | 8/2006 | Bera et al. |
| 2006/0254717 A1 | 11/2006 | Kobayashi et al. |
| 2006/0278341 A1 | 12/2006 | Park et al. |
| 2006/0292310 A1 | 12/2006 | Le et al. |
| 2007/0023145 A1 | 2/2007 | Bera et al. |
| 2007/0034154 A1 | 2/2007 | Fink |
| 2007/0051472 A1 | 3/2007 | Murakami et al. |
| 2007/0056688 A1 | 3/2007 | Kim et al. |
| 2007/0059460 A1 | 3/2007 | Abney et al. |
| 2007/0062452 A1 | 3/2007 | Pancham et al. |
| 2007/0102286 A1 | 5/2007 | Scheible et al. |
| 2007/0125646 A1 | 6/2007 | Young et al. |
| 2007/0134907 A1 | 6/2007 | Ikeda et al. |
| 2007/0151947 A1 | 7/2007 | Song et al. |
| 2007/0163878 A1 | 7/2007 | Nakamura |
| 2007/0166477 A1 | 7/2007 | Chang |
| 2007/0169891 A1 | 7/2007 | Koshiishi et al. |
| 2007/0170052 A1 | 7/2007 | Ritchie et al. |
| 2007/0173059 A1 | 7/2007 | Young et al. |
| 2007/0181064 A1 | 8/2007 | Fink |
| 2007/0215279 A1 | 9/2007 | Koshiishi |
| 2007/0224709 A1 | 9/2007 | Ogasawara |
| 2007/0240795 A1 | 10/2007 | Sato et al. |
| 2007/0273287 A1 | 11/2007 | Kuwahara et al. |
| 2007/0283884 A1 | 12/2007 | Tiller et al. |
| 2008/0000876 A1 | 1/2008 | Park et al. |
| 2008/0003385 A1 | 1/2008 | Takao et al. |
| 2008/0017516 A1 | 1/2008 | Han et al. |
| 2008/0038481 A1 | 2/2008 | West et al. |
| 2008/0041820 A1 | 2/2008 | Tong et al. |
| 2008/0066868 A1 | 3/2008 | Masuda |
| 2008/0087382 A1 | 4/2008 | Sugiyama et al. |
| 2008/0100221 A1 | 5/2008 | Kuwahara et al. |
| 2008/0110747 A1 | 5/2008 | Ding et al. |
| 2008/0110760 A1 | 5/2008 | Han et al. |
| 2008/0149595 A1 | 6/2008 | Cirigliano |
| 2008/0149598 A1 | 6/2008 | Hayashi et al. |
| 2008/0156264 A1 | 7/2008 | Fair et al. |
| 2008/0164146 A1 | 7/2008 | Ivanov et al. |
| 2008/0178801 A1 | 7/2008 | Pavloff et al. |
| 2008/0196661 A1 | 8/2008 | West |
| 2008/0223725 A1 | 9/2008 | Han et al. |
| 2008/0280066 A1 | 11/2008 | Schade Van Wes |

(56) References Cited

U.S. PATENT DOCUMENTS

| | | |
|---|---|---|
| 2008/0289958 A1 | 11/2008 | Kardokus et al. |
| 2008/0318433 A1 | 12/2008 | Dhindsa et al. |
| 2009/0041951 A1 | 2/2009 | Keil et al. |

FOREIGN PATENT DOCUMENTS

| | | |
|---|---|---|
| JP | 02133570 A | 5/1990 |
| JP | 10-237639 | 9/1998 |
| JP | 10237639 A | 9/1998 |
| JP | 11-209873 | 8/1999 |
| JP | 11209873 A | 8/1999 |
| JP | 2000-340523 A | 12/2000 |
| JP | 2002-520492 A | 7/2002 |
| JP | 2006-299331 | 11/2006 |
| JP | 2006-307243 | 11/2006 |
| JP | 2006299331 A | 11/2006 |
| JP | 2006307243 A | 11/2006 |
| JP | 2007-112641 | 5/2007 |
| JP | 2007112641 A | 5/2007 |
| JP | 2007-231392 | 9/2007 |
| JP | 2007231392 A | 9/2007 |
| JP | 2007-258447 | 10/2007 |
| JP | 2007-277659 | 10/2007 |
| JP | 2007-277730 | 10/2007 |
| JP | 2007258447 A | 10/2007 |
| JP | 2007277659 A | 10/2007 |
| JP | 2007277730 A | 10/2007 |
| JP | 2007-297699 | 11/2007 |
| JP | 2007297699 A | 11/2007 |
| JP | 2008-056990 | 3/2008 |
| JP | 2008056990 A | 3/2008 |
| JP | 2008-115446 | 5/2008 |
| JP | 2008-118015 | 5/2008 |
| JP | 2008115446 A | 5/2008 |
| JP | 2008118015 A | 5/2008 |
| JP | 2008-147703 | 6/2008 |
| JP | 2008147703 A | 6/2008 |
| JP | 2008-188647 | 8/2008 |
| JP | 2008188647 A | 8/2008 |

\* cited by examiner

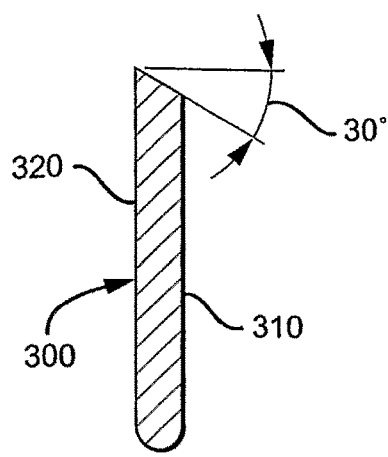
FIG. 3A
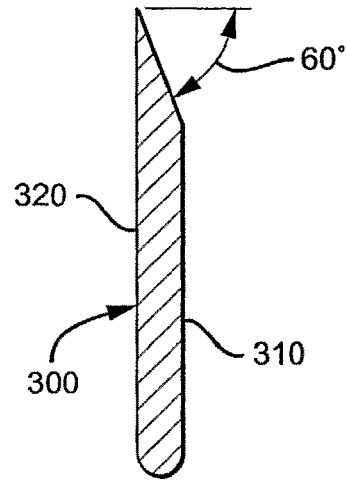
FIG. 3B
FIG. 4
PRIOR ART
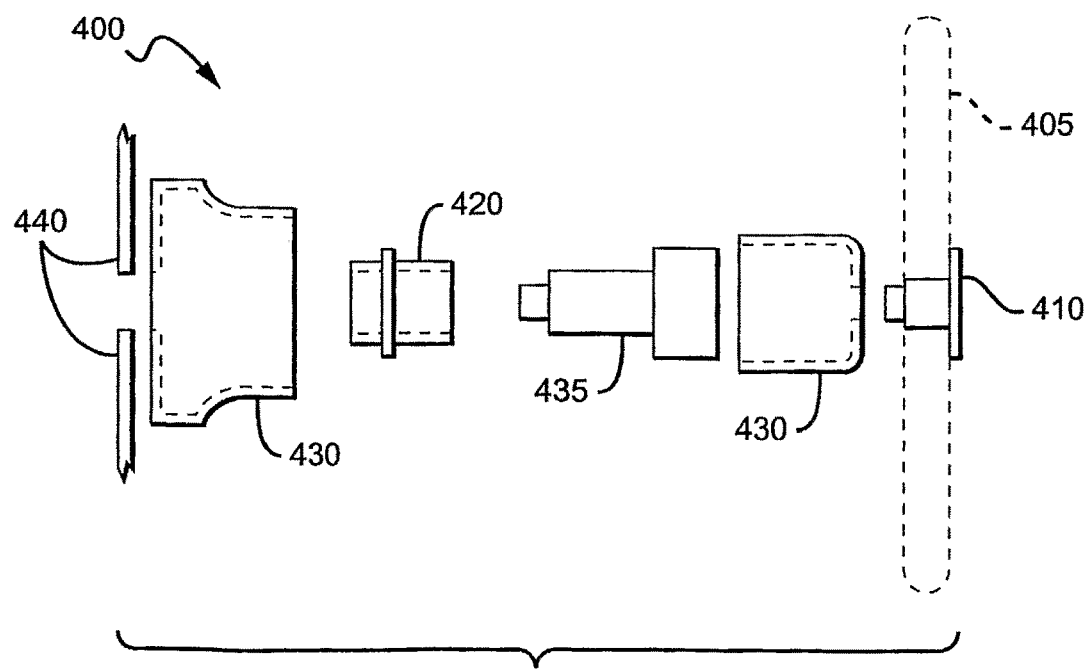

COILS UTILIZED IN VAPOR DEPOSITION APPLICATIONS AND METHODS OF PRODUCTION

FIELD OF THE INVENTION

The field of the invention is coils utilized in vapor deposition apparatus.

BACKGROUND OF THE INVENTION

Electronic and semiconductor components are used in ever-increasing numbers of consumer and commercial electronic products, communications products and data-exchange products. Examples of some of these consumer and commercial products are televisions, computers, cell phones, pagers, palm-type or handheld organizers, portable radios, car stereos, or remote controls. To meet the requirements for faster performance, the characteristic dimensions of features of integrated circuit devices have continued to be decreased. Manufacturing of devices with smaller feature sizes introduces new challenges in many of the processes conventionally used in semiconductor fabrication.

As a result of the size decrease in these products, the components that comprise the products must also become smaller and/or thinner. Examples of some of those components that need to be reduced in size or scaled down are microelectronic chip interconnections, semiconductor chip components, resistors, capacitors, printed circuit or wiring boards, wiring, keyboards, touch pads, and chip packaging.

When electronic and semiconductor components are reduced in size or scaled down, any defects that are present in the larger components are going to be exaggerated in the scaled down components. Thus, the defects that are present or could be present in the larger component should be identified and corrected, if possible, before the component is scaled down for the smaller electronic products.

In order to identify and correct defects in electronic, semiconductor and communications components, the components, the materials used and the manufacturing processes for making those components should be broken down and analyzed. Electronic, semiconductor and communication/data-exchange components are composed, in some cases, of layers of materials, such as metals, metal alloys, ceramics, inorganic materials, polymers, or organometallic materials. The layers of materials are often thin (on the order of less than a few tens of angstroms in thickness). In order to improve on the quality of the layers of materials, the process of forming the layer—such as physical vapor deposition of a metal or other compound—should be evaluated and, if possible, modified and improved.

In order to improve the process of depositing a layer of material, the surface and/or material composition must be measured, quantified and defects or imperfections detected. In the case of the deposition of a layer or layers of material, it is not the actual layer or layers of material that should be monitored but the material and surface of that material that is being used to produce the layer of material on a substrate or other surface and the intervening apparatus, such as a coil or collimator, that are placed between the target material and the substrate or other surface that should be monitored. For example, when depositing a layer of metal onto a surface or substrate by sputtering a target comprising that metal, the atoms and molecules being deflected or liberated from the target must travel a path to the substrate or other surface that will allow for an even and uniform deposition. Atoms and molecules traveling natural and expected paths after deflection and/or liberation from the target will unevenly deposit on the surface or substrate, including trenches and holes in the surface or substrate, the surrounding shield and other exposed surfaces inside the chamber. For certain surfaces and substrates, it may be necessary to redirect the atoms and molecules leaving the target in order to achieve a more uniform deposition, coating and/or film on the surface or substrate.

To this end, it would be desirable to develop and utilize a deposition apparatus and sputtering chamber system that will maximize uniformity of the coating, film or deposition on a surface and/or substrate. Coils and coil sets, such as those that are being produced by Honeywell Electronic Materials™, are consumable products placed inside the sputtering chamber or ionized plasma apparatus that redirect sputtered atoms and/or molecules to form a more uniform film and/or layer on a substrate and/or suitable surface. For background purposes, the coil is present in these systems and/or deposition apparatus as an inductively coupling device to create a secondary plasma of sufficient density to ionize at least some of the metal atoms that are sputtered from the target. In an ionized metal plasma system, the primary plasma forms and is generally confined near the target by the magnetron, and subsequently gives rise to atoms, such as Ti atoms, being ejected from the target surface. The secondary plasma formed by the coil system produces Ti, Cu & Ta ions (depending on material being sputtered). These metal ions are then attracted to the wafer by the field in the sheath that forms at the substrate (wafer) surface. As used herein, the term "sheath" means a boundary layer that forms between a plasma and any solid surface. This field can be controlled by applying a bias voltage to the wafer and/or substrate.

Conventional coils are suspended on ceramic electrical insulators to prevent the coil potential from shorting to the processing chamber shields that are attached to the process chamber walls, and are thus, at ground potential. The metal plasma will coat the ceramic insulators and form a short circuit. Shields, formed in the shape of cups, are placed around the ceramic to provide an optically dense path from the plasma to the ceramic that would prevent the deposition of metals on the ceramics. Typically, a small cup-like shield that encompasses the ceramic is attached to the coil and a larger cup-like shield is attached to the smaller cup-like shield such that the cups are electrically isolated from each other but collectively work to shield the ceramic. Under heat stress, the coil expands and reduces the nominal gap between the backside of the coil and the edge of the outside cup-like shield, creating a short circuit and interrupting the deposition process on the substrate.

In addition to those problems and potential defects described above, particle generation during physical vapor deposition (PVD) is one of the most detrimental factors that reduce the yield of functional chips in microelectronic device fabrication. In PVD systems, particles are mainly generated when deposits build up on surrounding chamber components and stress induced cracking occurs, particularly on the coil that is being used in the ionized metal plasma (IMP) and self ionized plasma (SIP) sputtering systems. Deposition mainly occurs on top of these coils.

Conventional coils and coils sets can be expensive and difficult to manufacture because of the size of the metal or metal alloy rod being used. Therefore, it would be desirable to develop better shaped and sized coils that are ultimately more cost efficient coils and coil sets for utilization with a deposition apparatus, a sputtering chamber system and/or ionized plasma deposition system without causing shorts, interruptions to the deposition process or inappropriate metal deposition. It would also be desirable to ensure that those new coils and coil sets will have a similar lifetime relative to the target being used, because decreasing the difference in lifetime between the coils, coil sets and targets would, at the very least, decrease the number of times the apparatus or systems have to be shut down to replace coils before replacing both the coil and target.

SUMMARY OF THE INVENTION

A coil assembly for utilization in a vapor deposition system is described herein that includes at least one subject coil having a length, a height, an inside edge, an outside edge and a thickness, wherein the thickness of the subject coil is measured as the distance between the inside edge and the outside edge and wherein at least part of the thickness of the subject coil is reduced by at least 20% as compared to a reference coil.

A coil assembly is also described herein for utilization in a vapor deposition system that includes at least one subject coil having a length, a height, an inside edge, an outside edge, and a thickness, wherein the thickness of the subject coil is measured as the distance between the inside edge and the outside edge and wherein at least part of the height of at least part of the subject coil is reduced by at least 20% as compared to the height of a reference coil.

BRIEF DESCRIPTION OF THE FIGURES

Prior Art

FIG. 3A shows a cross-sectional view of a contemplated coil design.

FIG. 3B shows a cross-sectional view of a contemplated coil design.

Prior Art FIG. 4 shows a cross-sectional view of a conventional coil design.

DESCRIPTION OF THE SUBJECT MATTER

Figure 1:
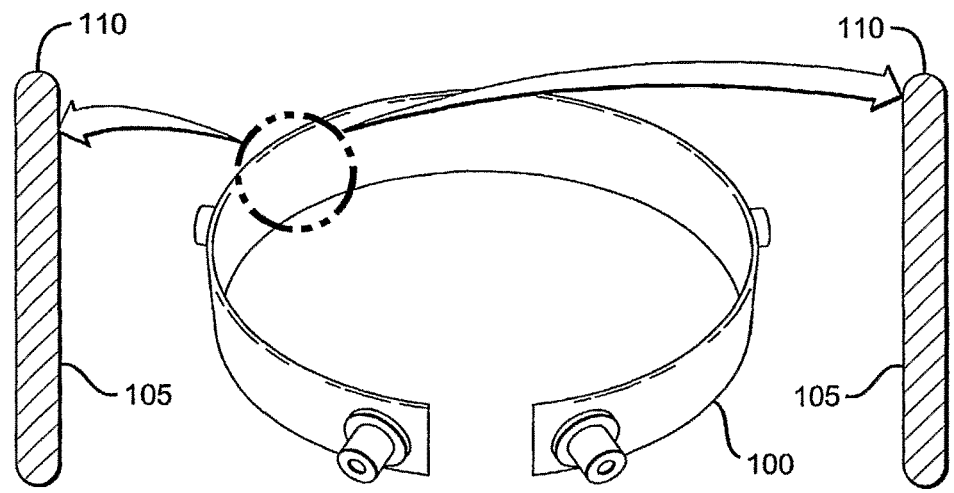
FIG. 1 shows a conventional coil design.

Better shaped and sized coils that are ultimately more cost efficient coils and coil sets for utilization with a deposition apparatus, a sputtering chamber system and/or ionized plasma deposition system have surprisingly been developed and will be disclosed herein. These new coils and coil sets will reduce the likelihood of shorts, minimize interruptions to the deposition process and reduce inappropriate metal deposition. These new coils and coil sets have a similar lifetime relative to the target being used, because as stated earlier, decreasing the difference in lifetime between the coils, coil sets and targets would, at the very least, decrease the number of times the apparatus or systems have to be shut down to replace coils before replacing both the coil and target.

In order to accomplish the goals of increasing the cost efficiency of the coils and coil sets while reducing the likelihood of shorts, minimizing interruptions to the deposition process, reducing inappropriate metal deposition, minimizing the difference in lifetime between the coil and/or coil set and the target, and maximizing the uniformity of the film, coating and/or layer deposited on the substrate, a coil set has been developed that utilizes size and shape-modified coils. It has been surprisingly found that when at least a portion of the thickness of the coil is reduced that the performance of the coil in the sputtering chamber improves.

Specifically, a coil assembly is described herein that comprises a subject coil for use in a sputtering deposition device wherein at least part of the thickness of the subject coil is reduced by at least 20% as compared to a reference coil. In some embodiments, at least part of the thickness of the subject coil is reduced by at least 20% over the full height of that portion of the coil where the thickness is being reduced as compared to a reference coil. In other embodiments, at least part of the thickness of the coil is reduced by at least 20% over at least a portion of the height of that part of the coil where the thickness is being reduced. In yet other embodiments, at least part of the thickness of the coil is reduced at an angle from the inside edge to the outside edge of the coil. Methods of forming and/or producing coil assemblies are described herein and comprise a) providing a coil and b) reducing the thickness of the coil by at least 20%.

A coil assembly is also described herein for utilization in a vapor deposition system that includes at least one subject coil having a length, a height, an inside edge, an outside edge, and a thickness, wherein the thickness of the subject coil is measured as the distance between the inside edge and the outside edge and wherein at least part of the height of at least part of the subject coil is reduced by at least 20% as compared to the height of a reference coil.

As used herein, the phrase "reference coil" means that it comprises the same materials as the "subject coil". In addition, the reference coil is considered a conventional coil—meaning that the reference coil does not have any significant reduction in thickness as compared to the subject coil. The "reference coil" is meant to be used as a "control".

A contemplated coil assembly comprises at least one coil and in some contemplated embodiments, a coil assembly comprises at least two coils. As described below, contemplated coils may comprise any suitable material including metals or metal alloys. Contemplated coils may have any suitable initial thickness, depending on the needs of the application. In some embodiments, contemplated coils are those coils that are considered "thin". As used herein, the phrase "thin coils" means coils that comprise a thickness of less than about 5 mm. The coil also has a height. In some embodiments, the height of the coil is less than about 76 mm. In other embodiments, the height of the coil is less than about 50 mm. In yet other embodiments, the height of the coil is less than about 40 mm. And in other embodiments, the height of the coil is less than about 25 mm. In addition, contemplated coils have a length. In some embodiments, the length of a coil can be greater than 30 cm, greater than 60 cm and/or 1.5 meters and above.

Figure 7:
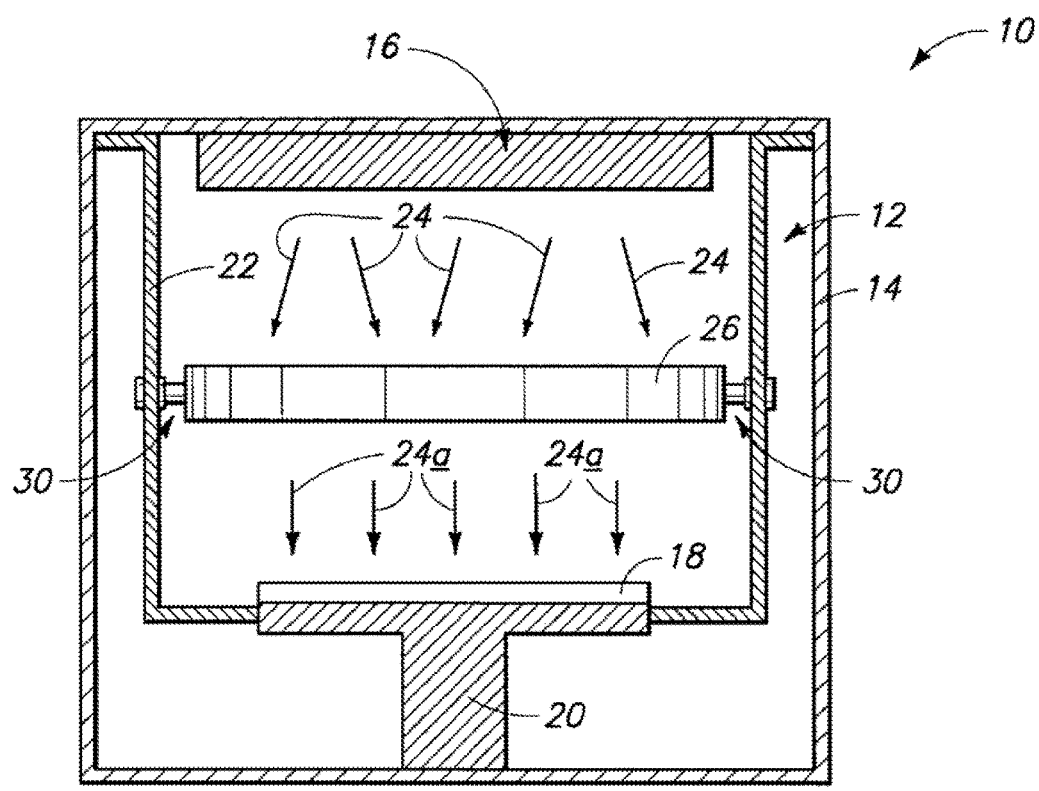
FIG. 7 is a diagrammatic cross-sectional view of a prior art physical vapor deposition apparatus shown during a physical vapor deposition (e.g., sputtering) process.

FIG. 7 is a diagrammatic cross-sectional view of a prior art physical vapor deposition apparatus. During physical vapor deposition, material is sputtered from a surface of target 16 and directed toward substrate 18. The sputtered material is represented by arrows 24. Generally, the sputtered material will leave the target surface in a number of different directions. This can be problematic and it is preferred that the sputtered material be directed relatively orthogonal to an upper surface of the substrate 18. Accordingly, a focusing coil 26 is provided within chamber 12. The focusing coil can improve the orientation of sputtered materials as depicted in FIG. 1 by arrows 24a. As shown, initially sputtered material can be redirected by passing through coil 26 to proceed relatively orthogonal to the upper surface of substrate 18.

Coil 26 is retained within chamber 12 by support members 30. Supports 30 can typically provide attachment of coil 26 to shield 22. Because shield 22 and coil 26 are each conductive, support structure 30 can typically provide electrical insulation between the shield and the coil.

Coil 26 can typically be formed from a conductive material which is generally the same as the target since material can be sputtered from the coil by plasma ions during deposition processing.

Coil 26 is generally provided within the chamber as a kit comprising pins, retaining screws, cups, and insulative pieces along with various other components (e.g. inner conductor components). The coils utilized in such kits will comprise annular rings (referred to herein as annular bodies or annular coil bodies) having openings extending therethrough. Coil 26 will wear out with time and replacement kits are provided for replacement of the coil. Such kits will typically comprise a coil together with the numerous separate components for attaching the coil to the shield.

In PVD systems, particles are mainly generated when deposits build up on surrounding chamber components and stress induced cracking occurs, particularly on the coil that is being used in the ionized metal plasma (IMP) and self ionized plasma (SIP) sputtering systems. Deposition mainly occurs on top of these coils. In order to address the problem of particle generation during physical vapor deposition (PVD), which is one of the most detrimental factors that reduce the yield of functional chips in microelectronic device fabrication, a new coil design has been developed. Conventional coil designs have an oblong top or a top with a beveled edge on the outside edge, but still has a narrow flat top. A conventional coil 100 with a blow up showing the oblong top 110 is shown in Prior Art FIG. 1.

Figure 2:
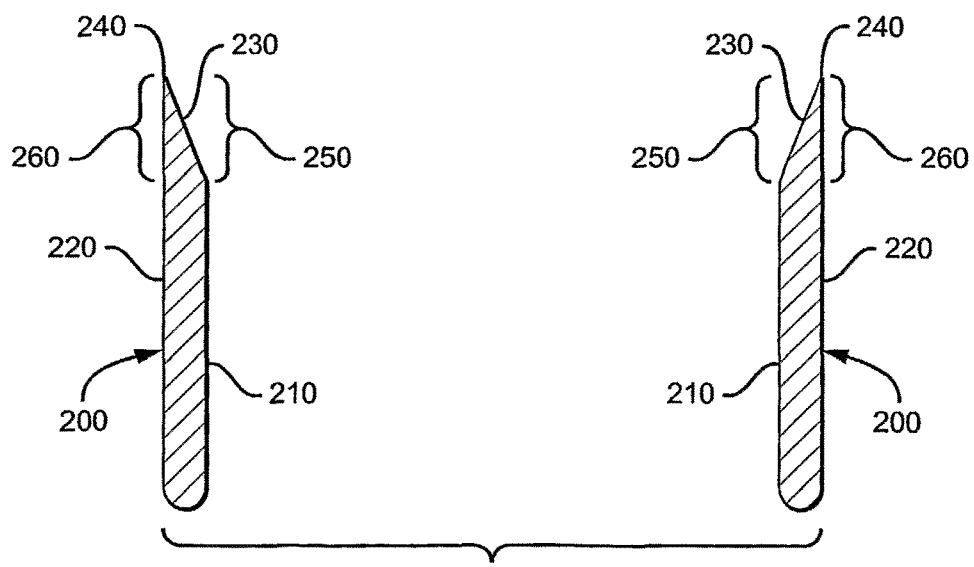
FIG. 2 shows a cross-sectional view of a contemplated coil design.

In FIG. 2, a coil 200 where at least part of the thickness of the coil is reduced at an angle 230 from the inside edge 210 to the outside edge 220 of the coil 200 is shown. Typical angles that may be used are 30 or 60 degree angles (shown in FIGS. 3A and 3B). This novel design of creating an angle from the inside edge to the outside edge of the coil creates coils that are effectively "reduced particle shedding coils". In a PVD system, sputtered atoms bombard the coil at a speed greater than 10 km/s on average. When these atoms hit the coil, the atoms are knocked off from the coil instead of depositing on it, if the coil's top edge is made sharp. The sharpening effect is further enhanced for the beveled coil edge by plasma sputtering. Depositions that would normally build up on the top surfaces of conventional coils are now minimized because of the sharp top edge that has been created. The new sharp top of the coil (shown as 240 in FIG. 2) can be constantly cleaned away by the bombardment of sputtered atoms coming from the target at high speed, while the exposed beveled part (shown as 250 in FIG. 2) can be cleaned by the plasma from the inside of the coil. The outside vertical coil surface (shown as 260 in FIG. 2) is parallel to the beam direction, so it collects very little deposition.

Figure 5:
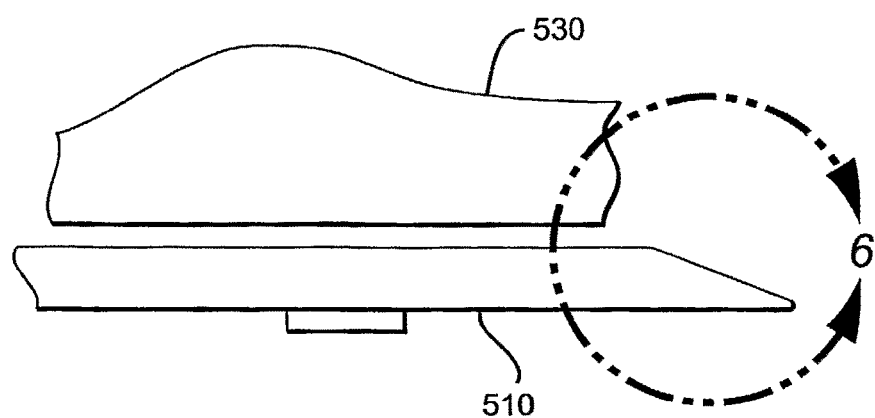
FIG. 5 shows a cross-sectional view of a contemplated coil assembly design.
Figure 6:
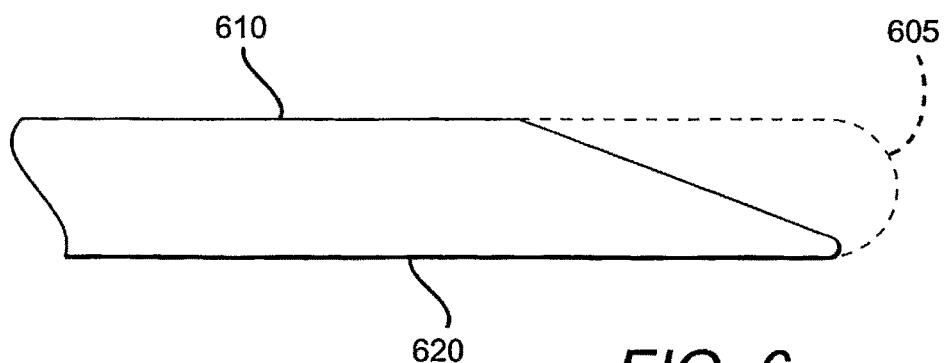
FIG. 6 shows a cross-sectional blow up view of a contemplated coil design.

In those embodiments where a ceramic electrical insulator is used to suspend the coil and where cup-like shields are utilized to prevent shorting, it has been surprisingly found that if the thickness of the coil is reduced by at least 20% over at least a portion of the height of the coil that any additional shorting can be reduced, undesirable metal deposition can be reduced and interruptions to the deposition process can be reduced. Prior Art FIG. 4 shows a conventional coil assembly 400 that includes a coil 410, a ceramic insulator 420 and cup-like shields 430. These types of coil assemblies are found in U.S. Ser. No. 10/880,172 filed on Jun. 28, 2004, which is commonly owned by Honeywell International Inc. and incorporated herein in its entirety by reference. FIG. 5 shows a contemplated embodiment of a coil assembly as described herein that comprises a coil 510 that has a reduced thickness, a ceramic insulator 520 and cup-like shields 530. FIG. 6 shows a blow up of a contemplated embodiment of a coil 600 that has a reduced thickness between an inside edge 610 and an outside edge 620. In some embodiments, the thickness of the coil may be reduced by at least 30% over at least a portion of the height of the coil. In other embodiments, the thickness of the coil may be reduced by at least 50% over at least a portion of the height of the coil. For example, a contemplated coil has a thickness of about 3 mm and a height of about 50 mm. In order to prevent shorting, the last 4 mm before the end of the coil can have a reduced thickness of about 1.5 mm from the original about 3 mm (a reduction of about 50%). This reduction in thickness can be over the entire 50 mm height or a portion of the 50 mm height. In some embodiments, the reduction in thickness can be over a section approximately 30 mm centered on the coil's height. Once this gap is created between the RF coil and the outer cup, the likelihood of shorting decreases.

In contemplated embodiments, the coil material comprises the same material as the target material; however, it is not always necessary that the coil material and the target material be the same. For example, the coil may comprise tantalum or titanium and the target may comprise a tantalum alloy or a titanium alloy, such as TaN or TiZr. The material used to produce the coil may comprise any suitable material, such as those listed below as suitable for the target material, however, it is contemplated that the material will comprise a material that is at least similar and/or compatible to the target material.

In some embodiments, it would also be ideal to include a sensing system that would a) comprise a simple device/apparatus and/or mechanical setup and a simple method for determining wear, wear-out and/or deterioration of a surface or material; b) would notify the operator when maintenance is necessary, as opposed to investigating the quality of the material on a specific maintenance schedule; and c) would reduce and/or eliminate material waste by reducing and/or eliminating premature replacement or repair of the material. Sensing devices and sensor systems contemplated herein can be found in U.S. Provisional Application Ser. No. 60/410,540, which is incorporated herein in its entirety.

Methods of forming and/or producing coil assemblies are described herein and comprise a) providing a coil; and b) reducing the thickness of the coil by at least 20%. Contemplated methods also include a) providing a coil; and b) reducing at least part of the height of at least part of the coil by at least 20%. The coil may be provided by any suitable method, including a) buying at least some of the coil from a supplier; b) preparing or producing at least some of the coil in house using materials provided by another source and/or c) preparing or producing the coil in house using materials also produced or provided in house or at the location.

Sputtering targets and sputtering target assemblies contemplated herein comprise any suitable shape and size depending on the application and instrumentation used in the PVD process. Sputtering targets contemplated herein also comprise a surface material and a core material (which includes the backing plate), wherein the surface material is coupled to the core material through and/or around a gas chamber or gas stream. The surface material and core material may generally comprise the same elemental makeup or chemical composition/component, or the elemental makeup and chemical composition of the surface material may be altered or modified to be different than that of the core material. In most embodiments, the surface material and the core material comprise the same elemental makeup and chemical composition. However, in embodiments where it may be important to detect when the target's useful life has ended or where it is important to deposit a mixed layer of materials, the surface material and the core material may be tailored to comprise a different elemental makeup or chemical composition.

The surface material is that portion of the target that is exposed to the energy source at any measurable point in time and is also that part of the overall target material that is intended to produce atoms and/or molecules that are desirable as a surface coating.

Sputtering targets and/or coils may generally comprise any material that can be a) reliably formed into a sputtering target or coils; b) sputtered from the target (and sometimes the coil) when bombarded by an energy source; and c) suitable for forming a final or precursor layer on a wafer or surface. It should be understood that although the coil comprises materials that are considered the same or similar to those materials being sputtered, the coil may or may not sputter atoms. Coil sputtering depends primarily on the coil bias with respect to the plasma. Materials that are contemplated to make suitable sputtering targets and/or coils are metals, metal alloys, conductive polymers, conductive composite materials, dielectric materials, hardmask materials and any other suitable sputtering material. As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include titanium, silicon, cobalt, copper, nickel, iron, zinc, vanadium, zirconium, aluminum and aluminum-based materials, tantalum, niobium, tin, chromium, platinum, palladium, gold, silver, tungsten, molybdenum, cerium, promethium, thorium, ruthenium or a combination thereof. More preferred metals include copper, aluminum, tungsten, titanium, cobalt, tantalum, magnesium, lithium, silicon, manganese, iron or a combination thereof. Most preferred metals include copper, aluminum and aluminum-based materials, tungsten, titanium, zirconium, cobalt, tantalum, niobium, ruthenium or a combination thereof. Examples of contemplated and preferred materials, include aluminum and copper for superfine grained aluminum and copper sputtering targets; aluminum, copper, cobalt, tantalum, zirconium, and titanium for use in 200 mm and 300 mm sputtering targets, along with other mm-sized targets; and aluminum for use in aluminum sputtering targets that deposit a thin, high conformal "seed" layer of aluminum onto surface layers. It should be understood that the phrase "and combinations thereof" is herein used to mean that there may be metal impurities in some of the sputtering targets, such as a copper sputtering target with chromium and aluminum impurities, or there may be an intentional combination of metals and other materials that make up the sputtering target, such as those targets comprising alloys, borides, carbides, fluorides, nitrides, suicides, oxides and others.

The term "metal" also includes alloys, metal/metal composites, metal ceramic composites, metal polymer composites, as well as other metal composites. Alloys contemplated herein comprise gold, antimony, arsenic, boron, copper, germanium, nickel, indium, palladium, phosphorus, silicon, cobalt, vanadium, iron, hafnium, titanium, iridium, zirconium, tungsten, silver, platinum, ruthenium, tantalum, tin, zinc, lithium, manganese, rhenium, and/or rhodium. Specific alloys include gold antimony, gold arsenic, gold boron, gold copper, gold germanium, gold nickel, gold nickel indium, gold palladium, gold phosphorus, gold silicon, gold silver platinum, gold tantalum, gold tin, gold zinc, palladium lithium, palladium manganese, palladium nickel, platinum palladium, palladium rhenium, platinum rhodium, silver arsenic, silver copper, silver gallium, silver gold, silver palladium, silver titanium, titanium zirconium, aluminum copper, aluminum silicon, aluminum silicon copper, aluminum titanium, chromium copper, chromium manganese palladium, chromium manganese platinum, chromium molybdenum, chromium ruthenium, cobalt platinum, cobalt zirconium niobium, cobalt zirconium rhodium, cobalt zirconium tantalum, copper nickel, iron aluminum, iron rhodium, iron tantalum, chromium silicon oxide, chromium vanadium, cobalt chromium, cobalt chromium nickel, cobalt chromium platinum, cobalt chromium tantalum, cobalt chromium tantalum platinum, cobalt iron, cobalt iron boron, cobalt iron chromium, cobalt iron zirconium, cobalt nickel, cobalt nickel chromium, cobalt nickel iron, cobalt nickel hafnium, cobalt niobium hafnium, cobalt niobium iron, cobalt niobium titanium, iron tantalum chromium, manganese iridium, manganese palladium platinum, manganese platinum, manganese rhodium, manganese ruthenium, nickel chromium, nickel chromium silicon, nickel cobalt iron, nickel iron, nickel iron chromium, nickel iron rhodium, nickel iron zirconium, nickel manganese, nickel vanadium, tungsten titanium and/or combinations thereof.

As far as other materials that are contemplated herein for sputtering targets and/or coils, the following combinations are considered examples of contemplated sputtering targets, coils and/or bosses (although the list is not exhaustive): chromium boride, lanthanum boride, molybdenum boride, niobium boride, tantalum boride, titanium boride, tungsten boride, vanadium boride, zirconium boride, boron carbide, chromium carbide, molybdenum carbide, niobium carbide, silicon carbide, tantalum carbide, titanium carbide, tungsten carbide, vanadium carbide, zirconium carbide, aluminum fluoride, barium fluoride, calcium fluoride, cerium fluoride, cryolite, lithium fluoride, magnesium fluoride, potassium fluoride, rare earth fluorides, sodium fluoride, aluminum nitride, boron nitride, niobium nitride, silicon nitride, tantalum nitride, titanium nitride, vanadium nitride, zirconium nitride, chromium silicide, molybdenum silicide, niobium silicide, tantalum silicide, titanium silicide, tungsten silicide, vanadium silicide, zirconium silicide, aluminum oxide, antimony oxide, barium oxide, barium titanate, bismuth oxide, bismuth titanate, barium strontium titanate, chromium oxide, copper oxide, hafnium oxide, magnesium oxide, molybdenum oxide, niobium pentoxide, rare earth oxides, silicon dioxide, silicon monoxide, strontium oxide, strontium titanate, tantalum pentoxide, tin oxide, indium oxide, indium tin oxide, lanthanum aluminate, lanthanum oxide, lead titanate, lead zirconate, lead zirconate-titanate, titanium aluminide, lithium niobate, titanium oxide, tungsten oxide, yttrium oxide, zinc oxide, zirconium oxide, bismuth telluride, cadmium selenide, cadmium telluride, lead selenide, lead sulfide, lead telluride, molybdenum selenide, molybdenum sulfide, zinc selenide, zinc sulfide, zinc telluride and/or combinations thereof.

Thin layers or films produced by the sputtering of atoms or molecules from targets discussed herein can be formed on any number or consistency of layers, including other metal layers, substrate layers, dielectric layers, hardmask or etch-stop layers, photolithographic layers, anti-reflective layers, etc. In some preferred embodiments, the dielectric layer may comprise dielectric materials contemplated, produced or disclosed by Honeywell International, Inc. including, but not limited to: a) FLARE (polyarylene ether), such as those compounds disclosed in issued patents U.S. Pat. No. 5,959,157, U.S. Pat. No. 5,986,045, U.S. Pat. No. 6,124,421, U.S. Pat. No. 6,156,812, U.S. Pat. No. 6,172,128, U.S. Pat. No. 6,171,687, U.S. Pat. No. 6,214,746, and pending application Ser. Nos. 09/197,478, 09/538,276, 09/544,504, 09/741,634, 09/651,396, 09/545,058, 09/587,851, 09/618,945, 09/619,237, 09/792,606, b) adamantane-based materials, such as those shown in pending application Ser. No. 09/545,058; Serial PCT/US01/22204 filed Oct. 17, 2001; PCT/US01/50182 filed Dec. 31, 2001; 60/345,374 filed Dec. 31, 2001; 60/347,195 filed Jan. 8, 2002; and 60/350,187 filed Jan. 15, 2002; c) commonly assigned U.S. Pat. Nos. 5,115,082; 5,986,045; and 6,143,855; and commonly assigned International Patent Publications WO 01/29052 published Apr. 26, 2001; and WO 01/29141 published Apr. 26, 2001; and (d) nanoporous silica materials and silica-based compounds, such as those compounds disclosed in issued patents U.S. Pat. No. 6,022,812, U.S. Pat. No. 6,037,275, U.S. Pat. No. 6,042,994, U.S. Pat. No. 6,048,804, U.S. Pat. No. 6,090,448, U.S. Pat. No. 6,126,733, U.S. Pat. No. 6,140,254, U.S. Pat. No. 6,204,202, U.S. Pat. No. 6,208,014, and pending application Ser. Nos. 09/046,474, 09/046,473, 09/111,084, 09/360,131, 09/378,705, 09/234,609, 09/379,866, 09/141,287, 09/379,484, 09/392,413, 09/549,659, 09/488,075, 09/566,287, and 09/214,219 all of which are incorporated by reference herein in their entirety and (e) Honeywell HOSP® organosiloxane.

The wafer or substrate may comprise any desirable substantially solid material. Particularly desirable substrates would comprise glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers such as polyimides. In more preferred embodiments, the substrate comprises a material common in the packaging and circuit board industries such as silicon, copper, glass, or a polymer.

Substrate layers contemplated herein may also comprise at least two layers of materials. One layer of material comprising the substrate layer may include the substrate materials previously described. Other layers of material comprising the substrate layer may include layers of polymers, monomers, organic compounds, inorganic compounds, organometallic compounds, continuous layers and nanoporous layers.

The substrate layer may also comprise a plurality of voids if it is desirable for the material to be nanoporous instead of continuous. Voids are typically spherical, but may alternatively or additionally have any suitable shape, including tubular, lamellar, discoidal, or other shapes. It is also contemplated that voids may have any appropriate diameter. It is further contemplated that at least some of the voids may connect with adjacent voids to create a structure with a significant amount of connected or "open" porosity. The voids preferably have a mean diameter of less than 1 micrometer, and more preferably have a mean diameter of less than 100 nanometers, and still more preferably have a mean diameter of less than 10 nanometers. It is further contemplated that the voids may be uniformly or randomly dispersed within the substrate layer. In a preferred embodiment, the voids are uniformly dispersed within the substrate layer.

Thus, specific embodiments and applications of coils utilized in vapor deposition applications and methods of production have been disclosed. It should be apparent, however, to those skilled in the art that many more modifications besides those already described are possible without departing from the inventive concepts herein. The inventive subject matter, therefore, is not to be restricted except in the spirit of the disclosure and claims herein. Moreover, in interpreting the disclosure and claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A coil assembly for utilization in a vapor deposition system comprising:
   at least one metal or metal alloy vapor deposition system coil comprising a length of greater than 30 cm, a height of less than about 76 mm, an inside edge, an outside edge, and a maximum thickness of less than about 5 mm, wherein the thickness of the coil is measured as the distance between the inside edge and the outside edge and wherein the thickness of a first portion of the coil is reduced by at least 20% as compared to the maximum thickness of the coil, and wherein at least part of the thickness of the coil comprises an angle from the inside edge to the outside edge of the coil to form a top edge having a point and wherein the outside edge of the coil is vertical up to the point of the top edge.

2. The coil assembly of claim 1, wherein the metal or metal alloy comprises a transition metal.

3. The coil assembly of claim 1, wherein the thickness of the coil is reduced by at least 30% as compared to the maximum thickness of the coil.

4. The coil assembly of claim 3, wherein the thickness of the first portion of the subject coil is reduced by at least 40% as compared to the maximum thickness of the coil.

5. The coil assembly of claim 4, wherein the thickness of the coil is reduced by at least 50% as compared to the maximum thickness of the coil.

6. The coil assembly of claim 1, wherein the distance between the inside edge and the outside edge comprises at least a 30 degree angle.

7. The coil assembly of claim 6, wherein the distance between the inside edge and the outside edge comprises at least a 60 degree angle.

8. A coil assembly for utilization in a vapor deposition system, the assembly comprising:
   a metal or metal alloy vapor deposition system coil having a height, an inside edge, an outside edge, a thickness measured between the inside edge and the outside edge, a first end, and a beveled edge at the first end, wherein the thickness of the coil decreases at an angle from the inside edge to the outside edge to form the beveled edge, and wherein the angle is between 30 degrees and 60 degrees.

9. The coil assembly of claim 8, wherein the metal or metal alloy comprises a transition metal.

10. The coil assembly of claim 8, wherein the beveled edge comprises a point.

11. The coil assembly of claim 10, wherein the outside edge is straight until the point.

12. A coil assembly for utilization in a vapor deposition system, the assembly comprising:
   an annular metal or metal alloy vapor deposition system coil having a diameter, an inside edge, an outside edge, a top edge, and a thickness measured in a cross-section taken across the diameter between the inside edge and the outside edge, wherein the thickness of the coil decreases at an angle from the inside edge to the outside edge at the top edge of the coil.

13. The coil assembly of claim 12, wherein the top edge is beveled.

14. The coil assembly of claim 12, wherein the top edge comprises a point.

15. The coil assembly of claim 14, wherein the outside edge is straight until the point.

16. The coil assembly of claim 12, wherein the coil is conductive.

17. The coil assembly of claim 12, wherein the angle is between 30 degrees and 60 degrees.

* * * * *